(12) United States Patent
Zhao et al.

(10) Patent No.: US 10,043,834 B2
(45) Date of Patent: Aug. 7, 2018

(54) BROKEN LINE REPAIR METHOD OF TFT SUBSTRATE

(71) Applicant: Shenzhen China Star Optoelectronics Technology Co., Ltd., Shenzhen (CN)

(72) Inventors: He Zhao, Shenzhen (CN); Kecheng Xie, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 84 days.

(21) Appl. No.: 15/117,452

(22) PCT Filed: Jun. 20, 2016

(86) PCT No.: PCT/CN2016/086438
§ 371 (c)(1),
(2) Date: Aug. 9, 2016

(87) PCT Pub. No.: WO2017/193455
PCT Pub. Date: Nov. 16, 2014

(65) Prior Publication Data
US 2018/0108687 A1    Apr. 19, 2018

(30) Foreign Application Priority Data

May 12, 2016    (CN) .......................... 2016 1 0321552

(51) Int. Cl.
*H01L 27/12*    (2006.01)
*H01L 21/66*    (2006.01)
*G02F 1/1362*    (2006.01)

(52) U.S. Cl.
CPC .......... *H01L 27/1262* (2013.01); *H01L 22/20* (2013.01); *H01L 27/124* (2013.01);
(Continued)

(58) Field of Classification Search
None
See application file for complete search history.

(56) References Cited

U.S. PATENT DOCUMENTS

2014/0238463 A1*    8/2014    Nese ................... H01L 31/1804
                                                                    136/244
2016/0126259 A1*    5/2016    Namin .................. H01L 27/124
                                                                    257/773

(Continued)

FOREIGN PATENT DOCUMENTS

CN    104765170    *    4/2015
CN    104777635    *    7/2015

*Primary Examiner* — Asok K Sarkar
(74) *Attorney, Agent, or Firm* — Leong C. Lei

(57) ABSTRACT

Disclosed is a broken line repair method of a TFT substrate. The method first finds out a broken line in the TFT substrate and a position of a broken point on the broken line. Then, positions of the passivation layer intersecting with the broken line at two ends of the broken point are processed, respectively to expose a metal layer, where the broken line is. Then, a metal growing film is formed on the passivation layer and the metal layer which is exposed at the two ends of the broken point. Finally, a protective film is formed on the surface of the metal growing film or the surface of the metal growing film is flattened and modified. By protecting the metal growing film or by flattening and modifying the surface of the metal growing film to reduce the roughness thereof, the breaking of the metal growing film can be prevented.

16 Claims, 13 Drawing Sheets

(52) U.S. Cl.
CPC ............... *G02F 1/136259* (2013.01); *G02F 2001/136263* (2013.01)

(56) References Cited

U.S. PATENT DOCUMENTS

2016/0141210 A1\* 5/2016 Lei .................. H01L 21/78
           438/462
2017/0170244 A1\* 6/2017 Kobayashi .......... H01L 27/3246

\* cited by examiner

BROKEN LINE REPAIR METHOD OF TFT SUBSTRATE

FIELD OF THE INVENTION

The present invention relates to a display technology field, and more particularly to a broken line repair method of a TFT substrate.

BACKGROUND OF THE INVENTION

The Liquid Crystal Display (LCD) is one of the most widely utilized flat panel displays, and the liquid crystal display panel is the core component of the Liquid Crystal Display.

The traditional liquid crystal panel generally comprises a Color Filter (CF), a Thin Film Transistor Array Substrate (TFT Array Substrate) and a Liquid Crystal Layer positioned in between. The working principle is that the liquid crystal molecules are positioned between the two parallel glass substrates, and many vertical and horizontal tiny little electrical lines are between the two glass substrates, and the light of backlight module is reflected to generate images by applying driving voltages or not for controlling the direction changes of the liquid crystal molecules. The thin film transistor (TFT) array manufactured on the thin film transistor array substrate is employed to drive the liquid crystal to rotate to control the display of each pixel. The color filter substrate comprises color filter layers, which is employed for forming colors of each pixel. The color filter layer comprises a red color resist, a green color resist and a blue color resist which are alternately aligned.

The broken line of the TFT substrate is the phenomenon that the broken point appears to the drive line or the signal line in the liquid crystal display panel caused by the process defect of the TFT substrate, and then some pixels always appear in the bright state as the liquid crystal display shows images. Because the broken line appears due to the process defect of the TFT substrate, the broken line ratio can never be decreased to be 0 by improving the production process, which is the inevitable defect in the liquid crystal display. The quality of the liquid crystal display with the broken line is poor. Once the broken line is found in the procedure of shipping out, the liquid crystal display has to be wasted, and the production cost increases. For diminishing the waste amount and reducing the production cost, the broken line detection is performed to the liquid crystal display after the manufacture process of the TFT is accomplished according to prior art, and the checked out broken line is repaired.

Please refer to FIG. 1 and FIG. 2, which are structure diagram and sectional diagram of the repair position of the TFT substrate after repair according to the TFT broken line repair method of prior art. The TFT broken line repair method arranges the repair structure in the sub pixel region adjacent to the broken point 21' of the broken line 20', and first, removing a portion of the color resist layer 600' of the sub pixel region adjacent to the broken point 21' which is on the passivation layer 500' to form a color resist groove 610' which is capable of connecting the two ends of the broken point 21', and then laser welding the two ends of the broken point 21' to remove the passivation layer 500' or the passivation layer 500' and the insulation layer 300' at two ends of the broken point 21' in the broken line 20', and then, employing the laser chemical vapor deposition (Laser CVD) to form the metal growing film 700' in the color resist groove 610' to connected the broken line 20', and next, making dark point in the sub pixel region where the color resist groove 610' is to accomplish the repair of the TFT broken line. Such TFT broken line repair method exposes the metal growing film 700', and because the metal growing film is conductive metal material such as tungsten, chromium or cadmium in general, and the surface of the metal growing film 700' is relatively rough. as cleaning the TFT substrate or reworking the alignment film (polyimide film) on the surface of the TFT substrate, corrosion and friction is generated to the metal growing film 700' to cause the breaking of the metal growing film 700' to fail the broken line repair of the TFT substrate and to lower the broken line repair success ratio of the TFT substrate.

SUMMARY OF THE INVENTION

An objective of the present invention is to provide a broken line repair method of a TFT substrate, which can promote the resistant to corrosion and the anti friction property of the metal growing film for repairing the broken line to prevent the breaking of the metal growing film in the following manufacture process to raise the broken line repair success ratio of the TFT substrate to ensure the product quality and to promote the product competitiveness.

For realizing the aforesaid objectives, the present invention provides a broken line repair method of a TFT substrate, comprising steps of:

step 1, providing a TFT substrate;

wherein the TFT substrate comprises: a substrate, a first metal layer, which is patterned and located on the substrate, an insulation layer covering the substrate and the first metal layer, a second metal layer, which is patterned and located on the insulation layer, and a passivation layer covering the insulation layer and the second metal layer;

step 2, finding out a broken line in the TFT substrate and a position of a broken point on the broken line;

step 3, processing positions of the passivation layer intersecting with the broken line at two ends of the broken point, respectively to expose a metal layer, where the broken line is;

step 4, forming a metal growing film on the passivation layer and the metal layer exposed at the two ends of the broken point to connect the broken line of the two ends of the broken point;

step 5, forming a protective film on a surface of the metal growing film or flattening and modifying the surface of the metal growing film.

The step 2 specifically comprises: putting the TFT substrate in an array test station for detection to find out the broken line in the TFT substrate and a position coordinate of the broken point on the broken line, and recording the coordinate of the broken point.

The step 3 specifically comprises: delivering the TFT substrate to a repair machine, and the repair machine finds the corresponding broken point according to the coordinate of the broken point; then processing the positions of the passivation layer intersecting with the broken line at two ends of the broken point by laser welding to expose the metal layer.

In the step 5, a specific method of forming the protective film on the surface of the metal growing film is: delivering the TFT substrate to a protective film manufacture process machine, and employing a nozzle of the protective film manufacture process machine to drop protective film material on the metal growing film, and moving the TFT substrate to an ultraviolet light curing apparatus to cure the protective film material to form the protective film covering the metal growing film.

Material of the protective film is acrylic resin or UV photosensitive resin.

A nozzle diameter of the nozzle of the protective film manufacture process machine is 0.5 µm-10 µm.

A wavelength of ultraviolet light emitted by the ultraviolet light curing apparatus is 100 µm-700 µm.

In the step 5, a specific method of flattening and modifying the surface of the metal growing film is: providing a laser head, and employing the laser head for flattening and modifying the surface of the metal growing film;

a frequency of laser emitted by the laser head is not lower than 1000 times/second, and a wavelength of the laser emitted by the laser head is 300 µm-700 µm.

The TFT substrate further comprises a color resist layer located on the passivation layer;

in the step 3, removing a portion of the color resist layer in an adjacent region of the broken point to form a color resist groove which can connect the two ends of the broken point on the broken line, and the color resist groove exposes the passivation layer under the color resist layer; processing the positions of the passivation layer intersecting with the broken line at the two ends of the broken point, respectively to expose the metal layer, where the broken line is;

the broken line repair method of the TFT substrate further comprises step 6, performing dark point process to a sub pixel region having the color resist groove to accomplish broken line repair of the TFT substrate.

In the step 4, forming the metal growing film on the passivation layer and the metal layer exposed at the two ends of the broken point inside the color resist groove.

The present invention further provides a broken line repair method of a TFT substrate, comprising steps of:

step 1, providing a TFT substrate;

wherein the TFT substrate comprises: a substrate, a first metal layer, which is patterned and located on the substrate, an insulation layer covering the substrate and the first metal layer, a second metal layer, which is patterned and located on the insulation layer, and a passivation layer covering the insulation layer and the second metal layer;

step 2, finding out a broken line in the TFT substrate and a position of a broken point on the broken line;

step 3, processing positions of the passivation layer intersecting with the broken line at two ends of the broken point, respectively to expose a metal layer, where the broken line is;

step 4, forming a metal growing film on the passivation layer and the metal layer exposed at the two ends of the broken point to connect the broken line of the two ends of the broken point;

step 5, forming a protective film on a surface of the metal growing film or flattening and modifying the surface of the metal growing film;

wherein the step 2 specifically comprises: putting the TFT substrate in an array test station for detection to find out the broken line in the TFT substrate and a position coordinate of the broken point on the broken line, and recording the coordinate of the broken point;

wherein the step 3 specifically comprises: delivering the TFT substrate to a repair machine, and the repair machine finds the corresponding broken point according to the coordinate of the broken point; then processing the positions of the passivation layer intersecting with the broken line at two ends of the broken point by laser welding to expose the metal layer.

The benefits of the present invention are: the present invention provides a broken line repair method of a TFT substrate. The method first finds out a broken line in the TFT substrate and a position of a broken point on the broken line. Then, positions of the passivation layer intersecting with the broken line at two ends of the broken point are processed, respectively to expose a metal layer, where the broken line is. Then, a metal growing film is formed on the passivation layer and the metal layer which is exposed at the two ends of the broken point. Finally, a protective film is formed on the surface of the metal growing film or the surface of the metal growing film is flattened and modified. By protecting the metal growing film with the protective film or by flattening and modifying the surface of the metal growing film to reduce the roughness thereof to prevent the breaking of the metal growing film due to corrosion or friction in the following manufacture process. It effectively raises the broken line repair success ratio of the TFT substrate to ensure the product quality and to promote the product competitiveness.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 3:
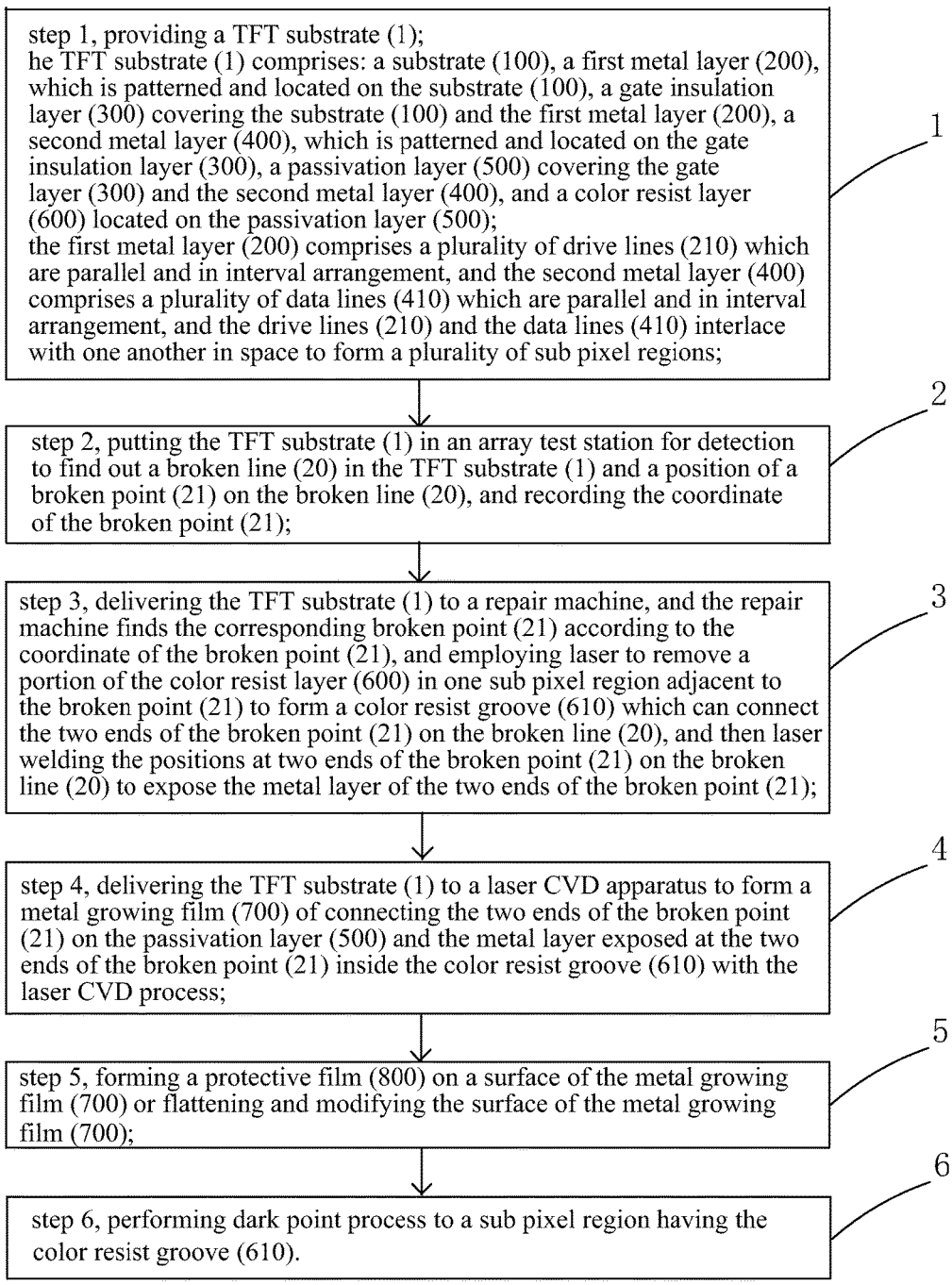
FIG. 3 is a flowchart of repairing the broken line in the TFT substrate display region with the broken line repair method of the TFT substrate according to the present invention.
Figure 4:
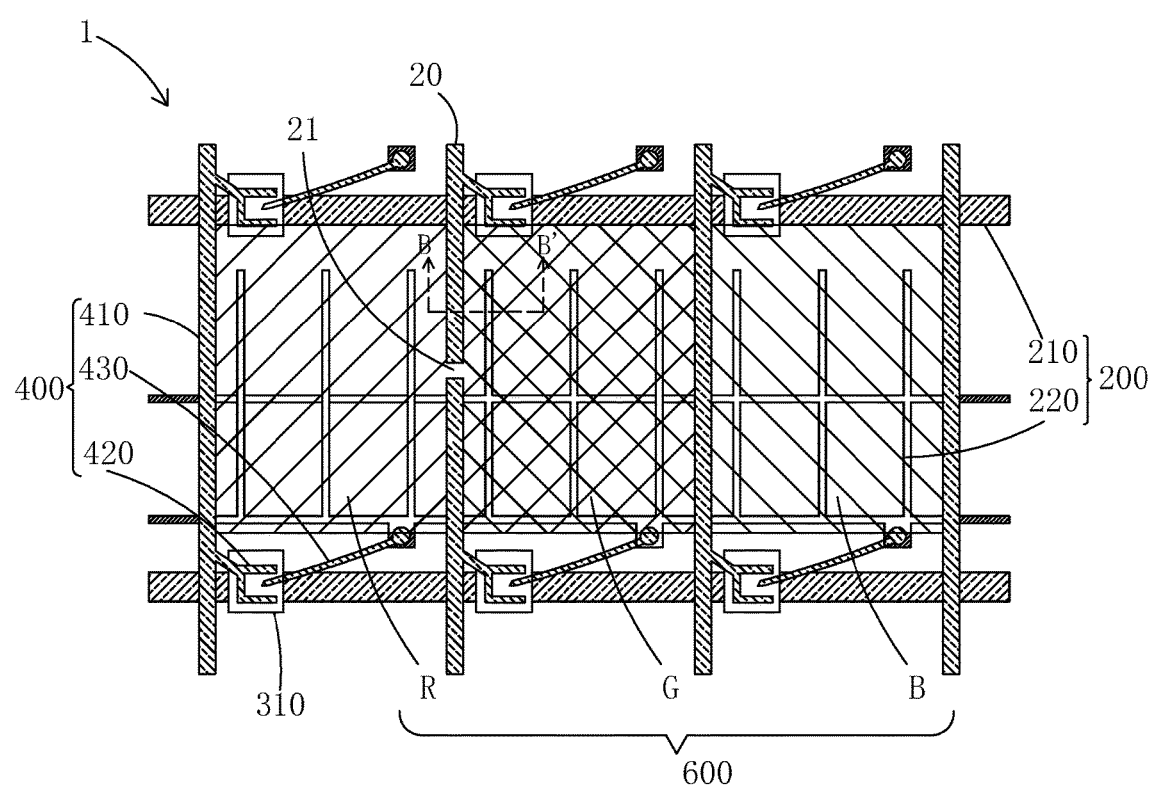
FIG. 4 is a diagram of the step 1 in the flowchart shown in FIG. 3.
Figure 5:
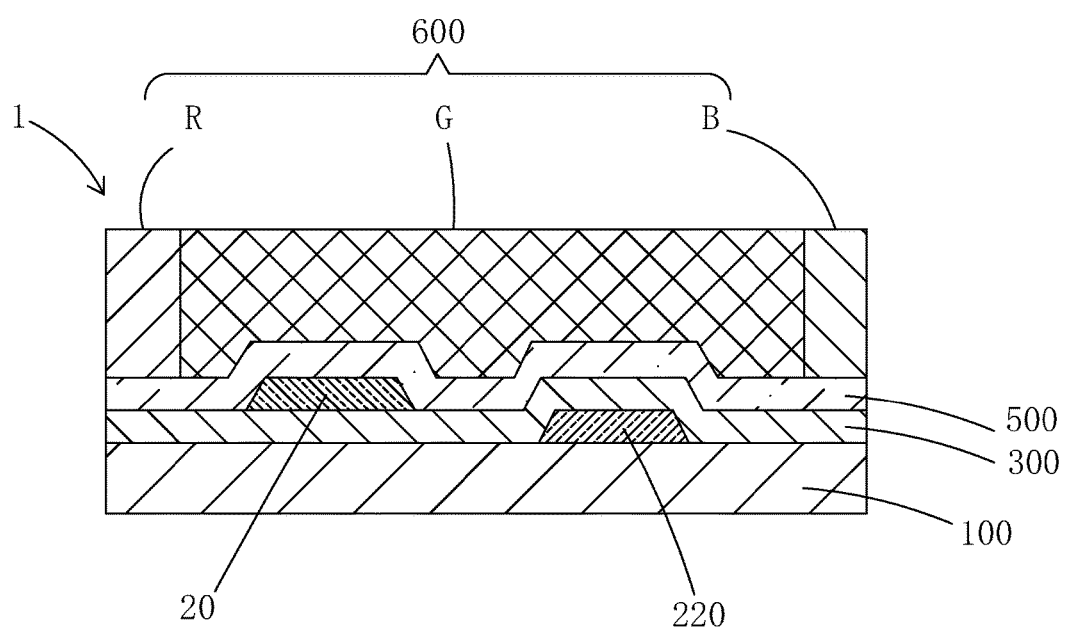
FIG. 5 is a sectional diagram corresponding to the B-B' position in FIG. 4.
Figure 14:
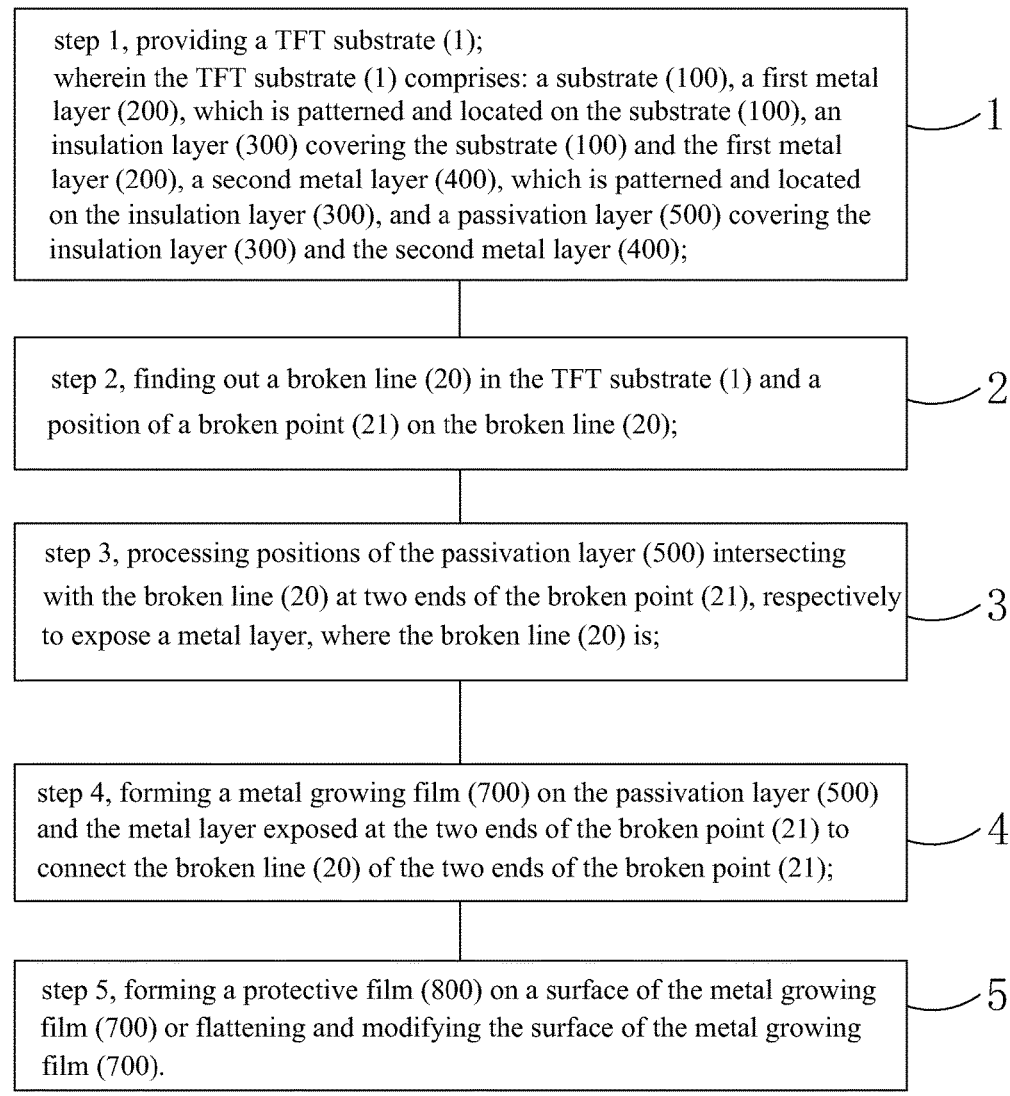
FIG. 14 is a flowchart of the broken line repair method of the TFT substrate according to the present invention.

Please refer to FIG. 14 combining FIG. 3, the present invention provides a broken line repair method of a TFT substrate. When the method is applied to repair the broken line in the display region of the TFT substrate, the method comprises steps of:

step 1, providing a TFT substrate 1;

referring to FIG. 4 and FIG. 5, the TFT substrate 1 comprises: a substrate 100, a first metal layer 200, which is patterned and located on the substrate 100, a gate insulation layer 300 covering the substrate 100 and the first metal layer 200, a second metal layer 400, which is patterned and located on the gate insulation layer 300, a passivation layer 500 covering the gate insulation layer 300 and the second metal layer 400, and a color resist layer 600 located on the passivation layer 500;

The first metal layer 200 comprises a plurality of drive lines 210 which are parallel and in interval arrangement, and the second metal layer 400 comprises a plurality of data lines 410 which are parallel and in interval arrangement, and the drive lines 210 and the data lines 410 interlace with one another in space to form a plurality of sub pixel regions.

Furthermore, the first metal layer 200 in the step 1 further comprises: the storage capacitor electrode line (CST Line) 220 covering the respective sub pixel regions, and a plurality of gates (not shown) corresponding to the respective sub pixel regions aligned in array, and the plurality of gates are electrically coupled to the corresponding drive lines 210 in the sub pixel region where they are respectively are; the insulation layer 300 comprises a gate insulation layer and an interlayer insulation layer which stack up, and a plurality of semiconductor layers 310 is formed between the gate insulation layer above the gate and the interlayer insulation layer; the second metal layer 400 in the step 1 further comprises a plurality of sources 420 and drains 430 which respectively correspond to the respective sub pixels aligned in array, and the plurality of sources 420 and drains 430 respectively contact with two ends of the corresponding semiconductor layers 310, and the plurality of sources 420 are electrically coupled to the corresponding data lines 410 in the sub pixel region where they are respectively are; the TFT substrate 1 further comprises a plurality of pixel electrodes (not shown) which are located on the color resist layer 600 and formed to respectively correspond the respective sub pixel regions, and the plurality of pixel electrodes are electrically coupled to the corresponding drains 430 in the sub pixel region where they are respectively are.

Specifically, the gate, the semiconductor layer 310, the source 420 and the drain 430 commonly form the switch TFTs of the respective sub pixel regions to control the writing of the data signal. The source 420 and the drain 430 contact with the semiconductor layer 310 through the vias formed in the interlayer insulation layer, and the pixel electrode contacts with the drain 430 through the via formed in the color resist layer 600 and the passivation layer 500, and the pixel electrode and the storage capacitor electrode line 220 are insulation overlapping to form a storage capacitor. Preferably, material of the insulation layer 300 and the passivation layer 500 is Silicon Oxide, Silicon Nitride or a combination of the two, and material of the first metal layer 200 and the second metal layer 400 is aluminum or copper.

Specifically, the color resist layer 600 comprises color resists of various kinds of colors. Preferably, the color resist layer 600 in the step 1 comprises a red color resist R, a green color resist G and a blue color resist B which are alternately aligned in sequence. Certainly, the color resist layer 600 also can further comprise color resists of kinds of colors, such as a white color resist, a yellow resist in advance.

step 2, putting the TFT substrate 1 in an array test station for detection to find out a broken line 20 in the TFT substrate 1 and a position of a broken point 21 on the broken line 20, and recording the coordinate of the broken point 21.

Specifically, the coordinate of the broken point 21 is recorded in the corresponding repair system. The respective apparatuses can obtain the coordinate from the repair system to find the position of the broken point 21.

Specifically, the broken line 20 can be the drive line 210 or can be the data line 410.

step 3, delivering the TFT substrate 1 to a repair machine, and the repair machine finds the corresponding broken point 21 according to the coordinate of the broken point 21, and employing laser to remove a portion of the color resist layer 600 in one sub pixel region adjacent to the broken point 21 to form a color resist groove 610 which can connect the two ends of the broken point 21 on the broken line 20, and then laser welding the positions at two ends of the broken point 21 on the broken line 20 to expose the metal layer of the two ends of the broken point 21.

Figure 1:
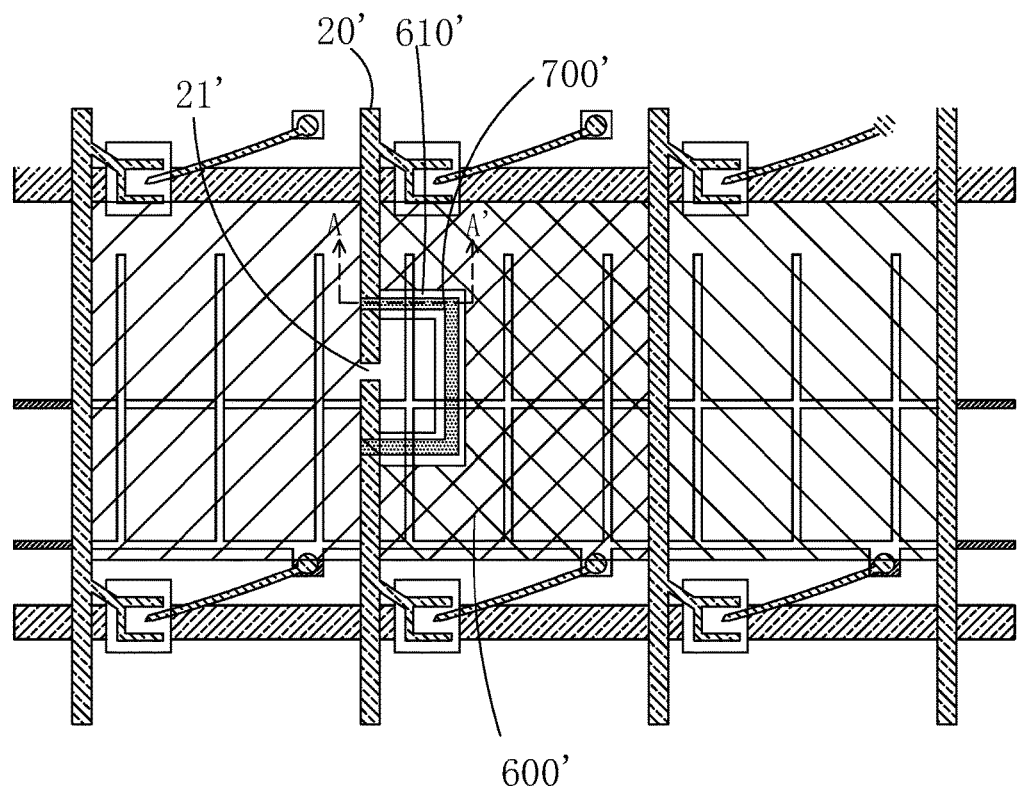
FIG. 1 is a structure diagram of the TFT substrate after repair with the broken line repair method of the TFT substrate according to prior art.
Figure 2:
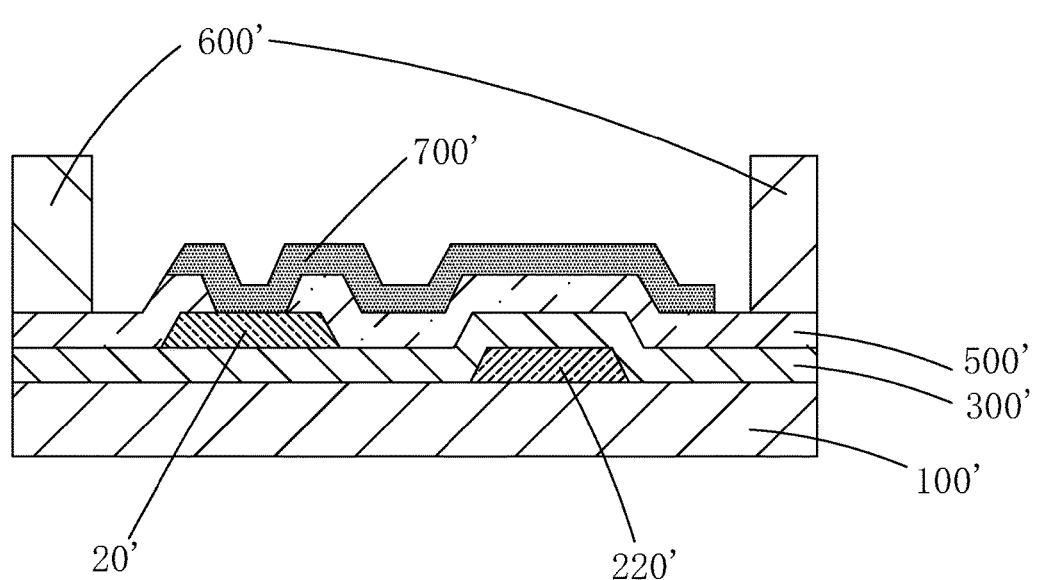
FIG. 2 is a sectional diagram corresponding to the A-A' line position in FIG. 1.
Figure 6:
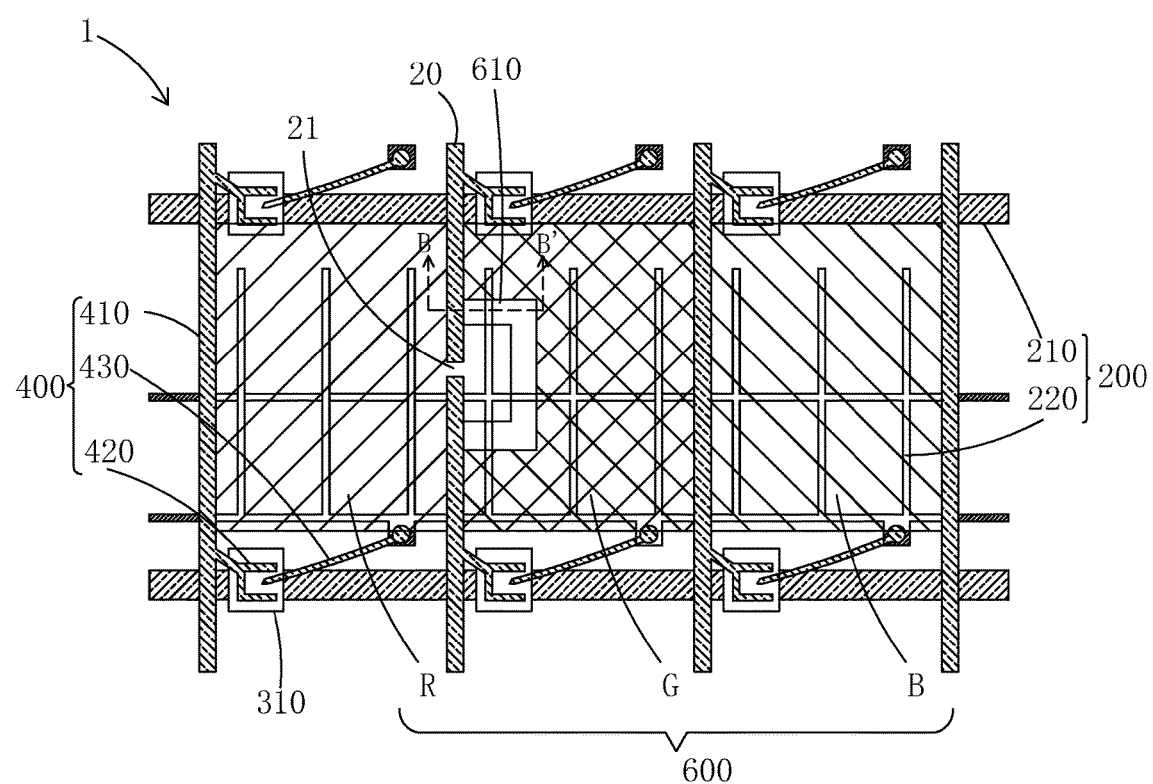
FIG. 6 is a diagram of the step 3 in the flowchart shown in FIG. 3.
Figure 7:
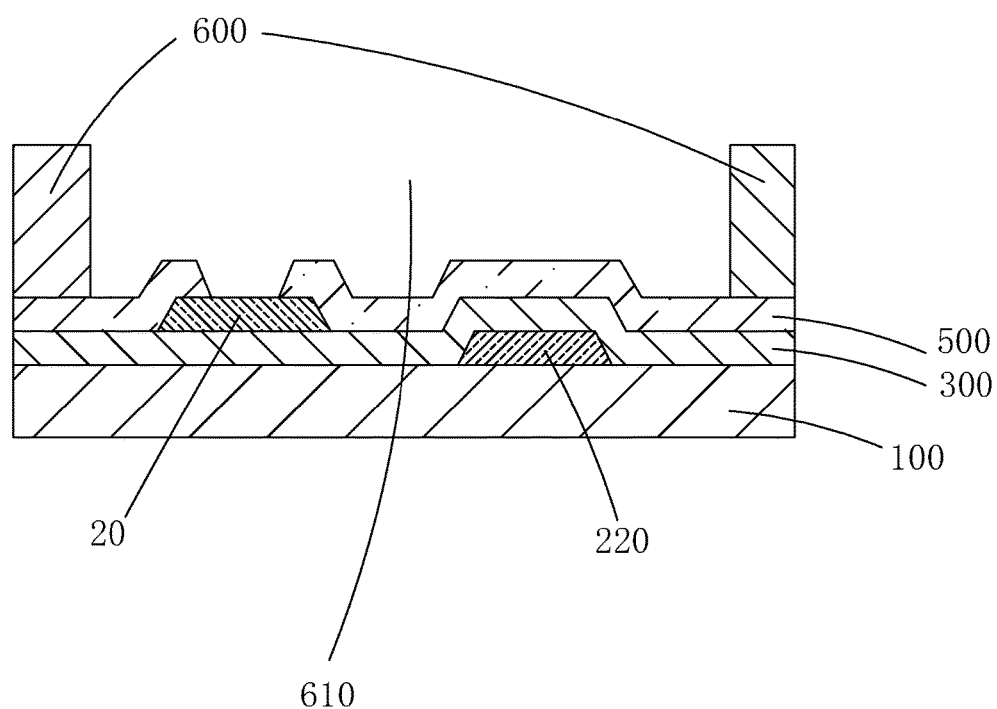
FIG. 7 is a sectional diagram corresponding to the B-B' position in FIG. 6.

Please refer to FIG. 6 and FIG. 7. When the broken line 20 is the data line 410, the passivation layer 500 of the two ends of the broken point 21 needs to be removed as laser welding. When the broken line 20 is the drive line 210, the passivation layer 500 and the insulation layer 300 of the two ends of the broken point 21 needs to be removed as laser welding. Besides, what is removed in FIG. 1 is a portion of the color resist layer 600 in one sub pixel region at the right side of the broken point. The solution of removing a portion of the color resist layer 600 in one sub pixel region at the left side of the broken point also can be utilized on demands.

step 4, delivering the TFT substrate 1 to a laser CVD apparatus to form a metal growing film 700 of connecting the two ends of the broken point 21 on the passivation layer 500 and the metal layer exposed at the two ends of the broken point 21 inside the color resist groove 610 with the laser CVD process.

Figure 8:
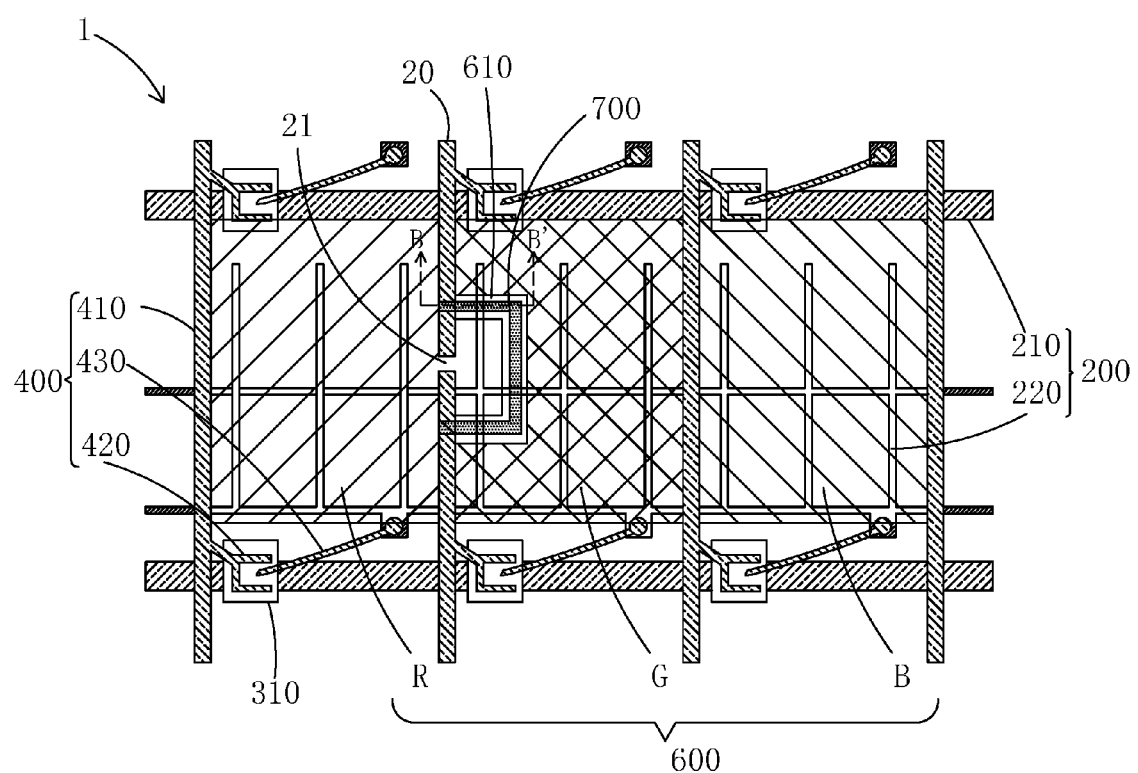
FIG. 8 is a diagram of the step 4 in the flowchart shown in FIG. 3.
Figure 9:
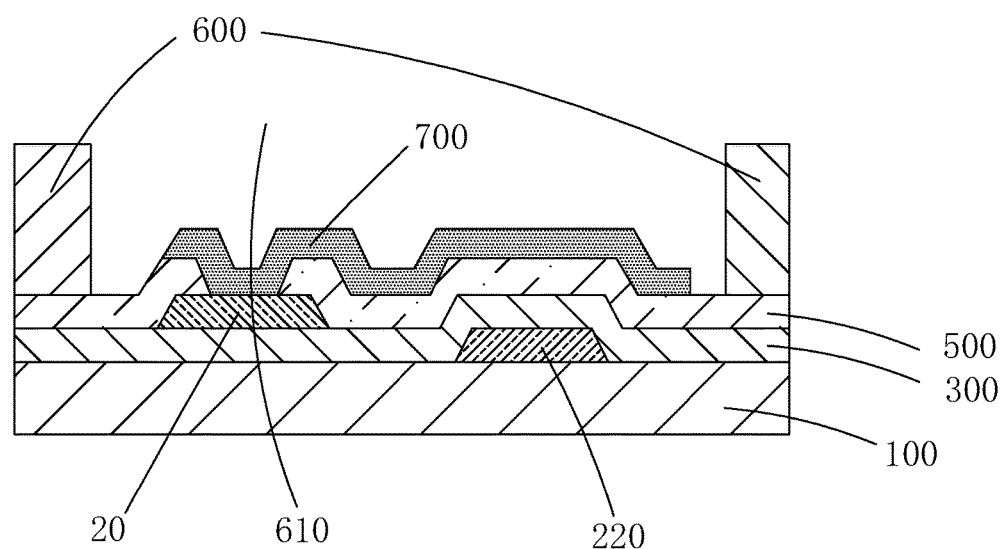
FIG. 9 is a sectional diagram corresponding to the B-B' position in FIG. 8.

Specifically, referring to FIG. 8 and FIG. 9, the metal growing film 700 is metal material and connects the two ends of the broken point 21 through the laser holes at the two ends of the broken point 21 to connect the broken line 20 for normally transmitting signal to accomplish the repair of the broken line 20.

step 5, forming a protective film 800 on a surface of the metal growing film 700 or flattening and modifying the surface of the metal growing film 700.

Figure 10:
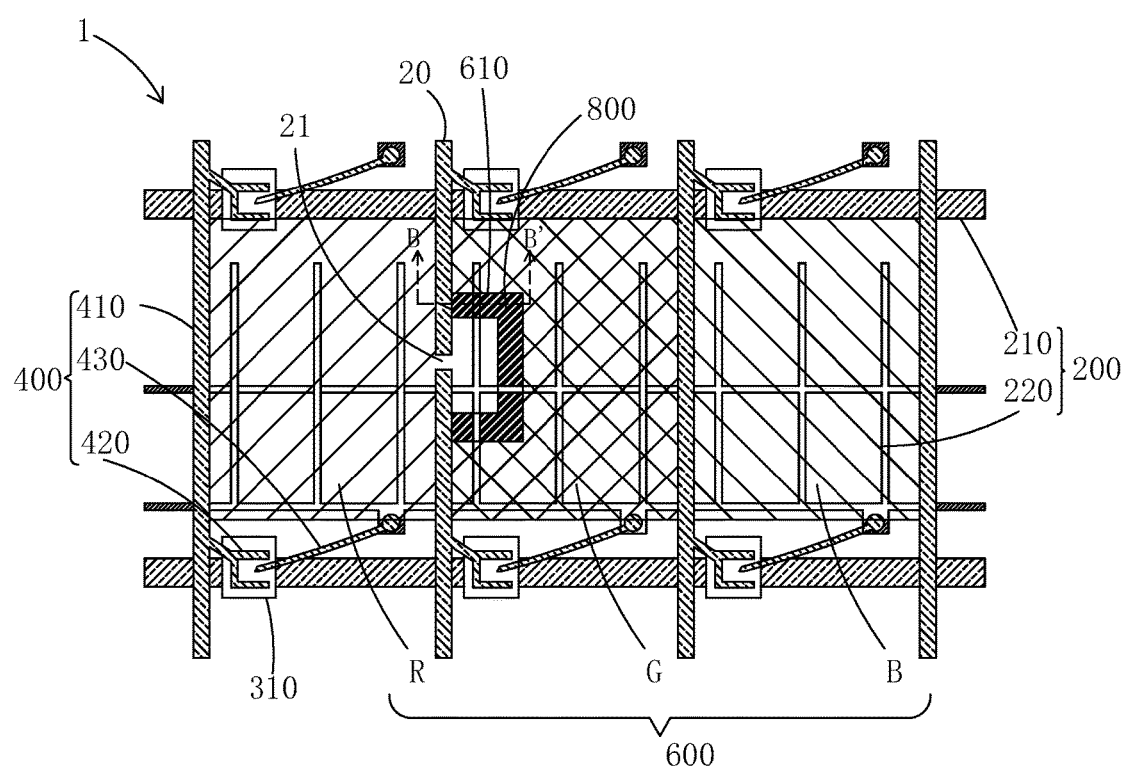
FIG. 10 is a diagram of forming the protective film on the surface of the metal growing film in the step 5 in the flowchart shown in FIG. 3.
Figure 11:
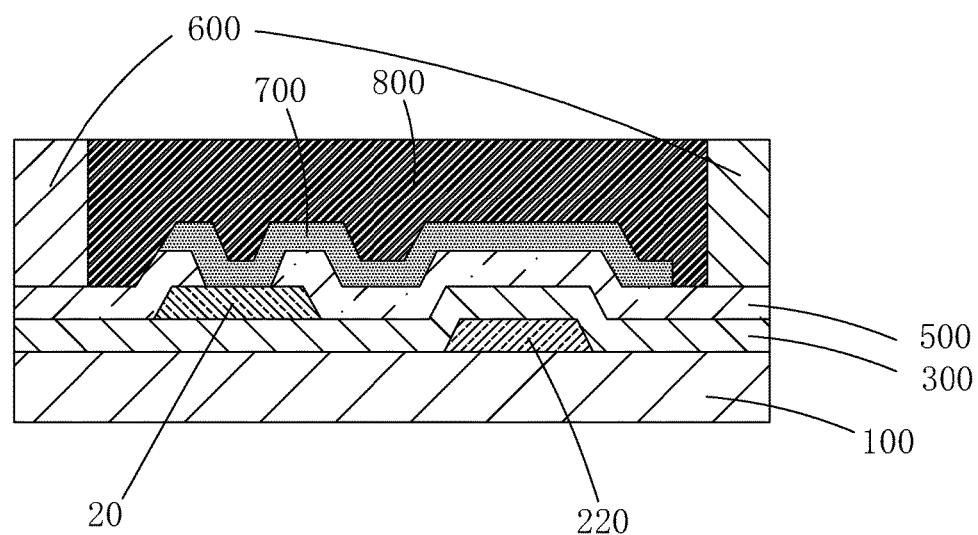
FIG. 11 is a sectional diagram corresponding to the B-B' line position in FIG. 10.

Specifically, referring to FIG. 10 and FIG. 11, in the step 5, a specific method of decide to form the protective film 800 on the surface of the metal growing film 700 is: delivering the TFT substrate 1 to a protective film manufacture process machine, and employing a nozzle of the protective film manufacture process machine to drop protective film material in the color resist groove 610, and moving the TFT substrate 1 to an ultraviolet light curing apparatus to cure the protective film material to form the protective film 800 covering the metal growing film 700.

Furthermore, material of the protective film 800 is polymer material. Different polymer materials can be selected according to the different product requirements. Preferably, material of the protective film 800 is acrylic resin or UV photosensitive resin. The nozzle diameter of the nozzle can be decided according to the size of the necessary repair position, i.e. the size of the color resist groove 610. Preferably, the range of the nozzle diameter of the nozzle is 0.5 μm-10 μm. A wavelength of ultraviolet light emitted by the ultraviolet light curing apparatus is 100 μm-700 μm.

Specifically, the surface of the metal growing film 700 is covered with the protective film 800 to avoid the direct contact with the external environment to promote the resistant to corrosion and the anti friction property of the metal growing film 700 to prevent the breaking of the metal growing film 700 due to corrosion or friction in the following clean process and the alignment film rework process of the TFT substrate. It can effectively raise the broken line repair success ratio of the TFT substrate to ensure the product quality.

Furthermore, as forming the protective film 800 on the surface of the metal growing film 700, and once the protective film 800 requires higher coating accuracy for satisfying the product requirement, one step of performing automatic optical check to the TFT substrate can be arranged after the protective film 800 is cured to ensure the coating accuracy of the protective film 800.

Figure 12:
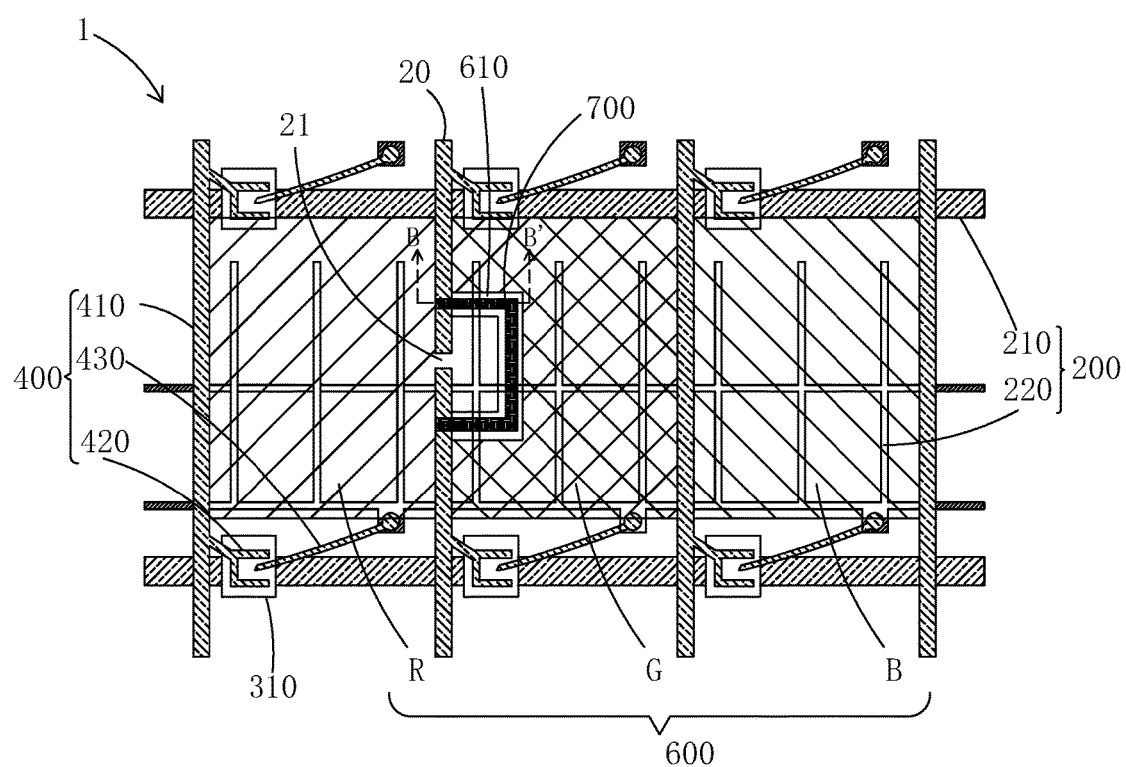
FIG. 12 is a diagram of flattening and modifying the metal growing film in the step 5 in the flowchart shown in FIG. 3.
Figure 13:
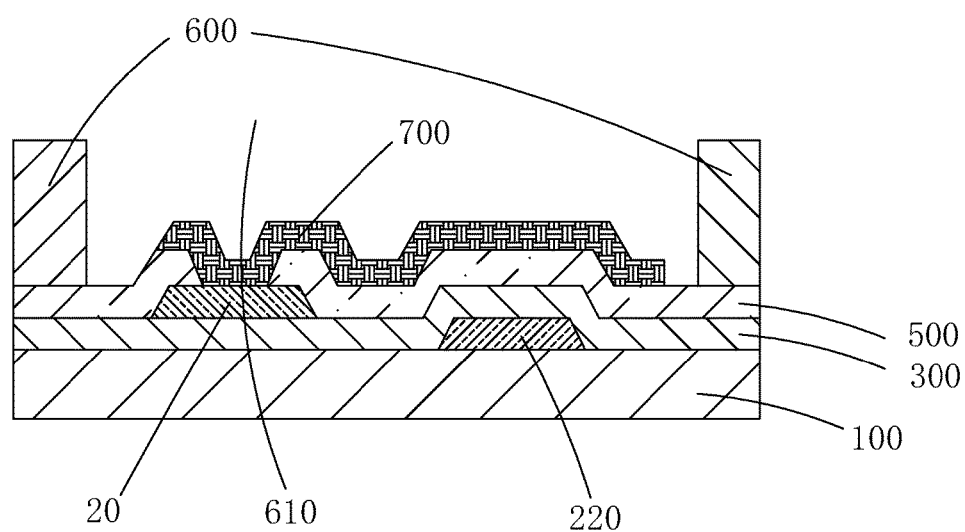
FIG. 13 is a sectional diagram corresponding to the B-B' line position in FIG. 12.

Specifically, referring to FIG. 12 and FIG. 13, in the step 5, a specific method of decide to flatten and modify the surface of the metal growing film 700 is: providing a high frequency laser head, and employing the high frequency laser head for modifying the metal growing film 700. A frequency of laser emitted by the high frequency laser head is not lower than 1000 times/second, and a wavelength of the laser emitted by the high frequency laser head is 300 µm-700 µm.

Specifically, the high frequency laser head is employed to modify the surface of the metal growing film 700 with the high frequency laser irradiation to effectively raise the flatness level of the metal growing film 700 to promote the resistant to corrosion and the anti friction property of the metal growing film 700 to prevent the breaking of the metal growing film 700 due to corrosion or friction in the following clean process and the alignment film rework process of the TFT substrate. It can effectively raise the broken line repair success ratio of the TFT substrate.

step 6, performing dark point process to a sub pixel region having the color resist groove 610.

Specifically, referring to FIG. 13, the step 6 specifically comprises:

step 61, cutting a storage capacitor electrode line 220 intersecting with the metal growing film 700 in space to prevent the short circuit of the metal growing film 700 and the storage capacitor electrode line 220.

Then, a connection between a source 420 of the sub pixel region which needs the dark point process and the data line 410 or a connection between a drain 420 and a pixel electrode is cut;

step 62, welding together the pixel electrode and the storage capacitor electrode line 220 of the sub pixel region which needs the dark point process to make the sub pixel region in a state of dark point.

It can be understood that the repair method of forming the protective film on the surface of the metal growing film or flattening and modifying the surface of the metal growing film provided by the present invention also can be applied to the non display region or other similar positions:

first, the passivation region above the metal to be repaired is exposed by process. The processing ways comprises regular physic or chemical remove for the other structure above the passivation layer (corresponding to the color resist layer in the display region in the aforesaid embodiment) to expose the passivation layer which is approximately above the metal line broken point to be repaired, and the passivation layer here is also named the insulation layer;

then, laser marking is employed to process the passivation layer to expose the metal layer at the broken line in the position where the broken line to be repaired at the two end of the broken point intersects with the passivation layer;

and then, forming a metal growing film 700 on the passivation layer and the metal layer exposed at the two ends of the broken point to connect the broken line of the two ends of the broken point;

finally, forming the protective film 800 on the surface of the metal growing film 700 or flattening and modifying the surface of the metal growing film 700, wherein the specific steps of forming the protective film 800 on the surface of the metal growing film 700 or flattening and modifying the surface of the metal growing film 700 is the same as the aforesaid embodiment. The repeated description is omitted here.

Specifically, the other specific details of the present invention applied for the broken line repair to the non display region belongs to prior art in this field, and the detail description is omitted, either.

In conclusion, the present invention provides a broken line repair method of a TFT substrate. The method first finds out a broken line in the TFT substrate and a position of a broken point on the broken line. Then, positions of the passivation layer intersecting with the broken line at two ends of the broken point are processed, respectively to expose a metal layer, where the broken line is. Then, a metal growing film is formed on the passivation layer and the metal layer which is exposed at the two ends of the broken point. Finally, a protective film is formed on the surface of the metal growing film or the surface of the metal growing film is flattened and modified. By protecting the metal growing film with the protective film or by flattening and modifying the surface of the metal growing film to reduce the roughness thereof to prevent the breaking of the metal growing film due to corrosion or friction in the following manufacture process. It effectively raises the broken line repair success ratio of the TFT substrate to ensure the product quality and to promote the product competitiveness.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A broken line repair method of a TFT substrate, comprising steps of:
   step 1, providing a TFT substrate;
   wherein the TFT substrate comprises: a substrate, a first metal layer, which is patterned and located on the substrate, an insulation layer covering the substrate and the first metal layer, a second metal layer, which is patterned and located on the insulation layer, and a passivation layer covering the insulation layer and the second metal layer;
   step 2, finding out a broken line in the TFT substrate and a position of a broken point on the broken line;
   step 3, processing positions of the passivation layer intersecting with the broken line at two ends of the broken point, respectively to expose a metal layer, where the broken line is;
   step 4, forming a metal growing film on the passivation layer and the metal layer exposed at the two ends of the broken point to connect the broken line of the two ends of the broken point;
   step 5, flattening and modifying the surface of the metal growing film by providing a laser head, and employing the laser head for flattening and modifying the surface of the metal growing film to promote a resistant to corrosion property and an anti friction property of the metal growing film; wherein a frequency of laser emitted by the laser head is not lower than 1000 times/second, and a wavelength of the laser emitted by the laser head is 300 µm-700 µm.

2. The broken line repair method of the TFT substrate according to claim 1, wherein the step 2 specifically comprises: putting the TFT substrate in an array test station for detection to find out the broken line in the TFT substrate and a position coordinate of the broken point on the broken line, and recording the coordinate of the broken point.

3. The broken line repair method of the TFT substrate according to claim 2, wherein the step 3 specifically comprises: delivering the TFT substrate to a repair machine, and the repair machine finds the corresponding broken point according to the coordinate of the broken point; then processing the positions of the passivation layer intersecting with the broken line at two ends of the broken point by laser marking to expose the metal layer.

4. The broken line repair method of the TFT substrate according to claim 1, wherein in the step 5, a specific method of forming the protective film on the surface of the metal growing film is: delivering the TFT substrate to a protective film manufacture process machine, and employing a nozzle of the protective film manufacture process machine to drop protective film material on the metal growing film, and moving the TFT substrate to an ultraviolet light curing apparatus to cure the protective film material to form the protective film covering the metal growing film.

5. The broken line repair method of the TFT substrate according to claim 4, wherein material of the protective film is acrylic resin or UV photosensitive resin.

6. The broken line repair method of the TFT substrate according to claim 4, wherein a nozzle diameter of the nozzle of the protective film manufacture process machine is 0.5 µm-10 µm.

7. The broken line repair method of the TFT substrate according to claim 4, wherein a wavelength of ultraviolet light emitted by the ultraviolet light curing apparatus is 100 µm-700 µm.

8. The broken line repair method of the TFT substrate according to claim 1, wherein the TFT substrate further comprises a color resist layer located on the passivation layer;
in the step 3, removing a portion of the color resist layer in an adjacent region of the broken point to form a color resist groove which can connect the two ends of the broken point on the broken line, and the color resist groove exposes the passivation layer under the color resist layer; processing the positions of the passivation layer intersecting with the broken line at the two ends of the broken point, respectively to expose the metal layer, where the broken line is;
the broken line repair method of the TFT substrate further comprises step 6, performing dark point process to a sub pixel region having the color resist groove to accomplish broken line repair of the TFT substrate.

9. The broken line repair method of the TFT substrate according to claim 8, wherein in the step 4, forming the metal growing film on the passivation layer and the metal layer exposed at the two ends of the broken point inside the color resist groove.

10. A broken line repair method of a TFT substrate, comprising steps of:
step 1, providing a TFT substrate;
wherein the TFT substrate comprises: a substrate, a first metal layer, which is patterned and located on the substrate, an insulation layer covering the substrate and the first metal layer, a second metal layer, which is patterned and located on the insulation layer, and a passivation layer covering the insulation layer and the second metal layer;
step 2, finding out a broken line in the TFT substrate and a position of a broken point on the broken line;
step 3, processing positions of the passivation layer intersecting with the broken line at two ends of the broken point, respectively to expose a metal layer, where the broken line is;
step 4, forming a metal growing film on the passivation layer and the metal layer exposed at the two ends of the broken point to connect the broken line of the two ends of the broken point;
step 5, flattening and modifying the surface of the metal growing film by providing a laser head, and employing the laser head for flattening and modifying the surface of the metal growing film to promote a resistant to corrosion property and an anti friction property of the metal growing film; wherein a frequency of laser emitted by the laser head is not lower than 1000 times/second, and a wavelength of the laser emitted by the laser head is 300 µm-700 µm;
wherein the step 2 specifically comprises: putting the TFT substrate in an array test station for detection to find out the broken line in the TFT substrate and a position coordinate of the broken point on the broken line, and recording the coordinate of the broken point;
wherein the step 3 specifically comprises: delivering the TFT substrate to a repair machine, and the repair machine finds the corresponding broken point according to the coordinate of the broken point; then processing the positions of the passivation layer intersecting with the broken line at two ends of the broken point by laser welding to expose the metal layer.

11. The broken line repair method of the TFT substrate according to claim 10, wherein in the step 5, a specific method of forming the protective film on the surface of the metal growing film is: delivering the TFT substrate to a protective film manufacture process machine, and employing a nozzle of the protective film manufacture process machine to drop protective film material on the metal growing film, and moving the TFT substrate to an ultraviolet light curing apparatus to cure the protective film material to form the protective film covering the metal growing film.

12. The broken line repair method of the TFT substrate according to claim 11, wherein material of the protective film is acrylic resin or UV photosensitive resin.

13. The broken line repair method of the TFT substrate according to claim 11, wherein a nozzle diameter of the nozzle of the protective film manufacture process machine is 0.5 µm-10 µm.

14. The broken line repair method of the TFT substrate according to claim 11, wherein a wavelength of ultraviolet light emitted by the ultraviolet light curing apparatus is 100 µm-700 µm.

15. The broken line repair method of the TFT substrate according to claim 10, wherein the TFT substrate further comprises a color resist layer located on the passivation layer;
in the step 3, removing a portion of the color resist layer in an adjacent region of the broken point to form a color resist groove which can connect the two ends of the broken point on the broken line, and the color resist groove exposes the passivation layer under the color resist layer; processing the positions of the passivation layer intersecting with the broken line at the two ends of the broken point, respectively to expose the metal layer, where the broken line is;

the broken line repair method of the TFT substrate further comprises step 6, performing dark point process to a sub pixel region having the color resist groove to accomplish broken line repair of the TFT substrate.

16. The broken line repair method of the TFT substrate according to claim 15, wherein in the step 4, forming the metal growing film on the passivation layer and the metal layer exposed at the two ends of the broken point inside the color resist groove.

\* \* \* \* \*